(12) United States Patent
Sinha et al.

(10) Patent No.: US 8,030,823 B2
(45) Date of Patent: Oct. 4, 2011

(54) PROTECTED RESONATOR

(75) Inventors: Rajarishi Sinha, Pittsburgh, PA (US); L. Richard Carley, Sewickley, PA (US); Louis Caley Chomas, Pittsburgh, PA (US); Hugo Safar, Westfield, NJ (US)

(73) Assignee: Resonance Semiconductor Corporation, Pittsburgh, PA (US)

( * ) Notice: Subject to any disclaimer, the term of this patent is extended or adjusted under 35 U.S.C. 154(b) by 0 days.

(21) Appl. No.: 12/321,860

(22) Filed: Jan. 26, 2009

(65) Prior Publication Data

US 2010/0187948 A1    Jul. 29, 2010

(51) Int. Cl.
*H01L 41/08* (2006.01)

(52) U.S. Cl. ..................................... 310/320

(58) Field of Classification Search .......... 310/320, 310/340, 348
See application file for complete search history.

(56) References Cited

U.S. PATENT DOCUMENTS

| | | | | |
|---|---|---|---|---|
| 5,203,537 | A * | 4/1993 | Jacobs et al. | 251/129.06 |
| 7,358,831 | B2 * | 4/2008 | Larson et al. | 333/187 |
| 7,557,493 | B2 * | 7/2009 | Fujimoto | 310/349 |
| 2003/0094431 | A1 * | 5/2003 | Shing et al. | 216/13 |
| 2005/0110597 | A1 | 5/2005 | Larson et al. | |
| 2006/0279175 | A1 | 12/2006 | Aigner | |

FOREIGN PATENT DOCUMENTS

| EP | 1548935 A1 | 6/2005 |
|---|---|---|
| JP | 2008172711 A | 7/2008 |

OTHER PUBLICATIONS

International Search Report, PCT/US2010/021975, dated Jul. 29, 2010.

* cited by examiner

*Primary Examiner* — Thomas Dougherty
(74) *Attorney, Agent, or Firm* — Lerner, David, Littenberg, Krumholz & Mentlik, LLC

(57) ABSTRACT

A bulk acoustic wave resonator structure that isolates the core resonator from both environmental effects and aging effects. The structure has a piezoelectric layer at least partially disposed between two electrodes. The structure is protected against contamination, package leaks, and changes to the piezoelectric material due to external effects while still providing inertial resistance. The structure has one or more protective elements that limit aging effects to at or below a specified threshold. The resonator behavior is stabilized across the entire bandwidth of the resonance, not just at the series resonance. Examples of protective elements include a collar of material around the core resonator so that perimeter and edge-related environmental and aging phenomena are kept away from the core resonator, a Bragg reflector formed above or below the piezoelectric layer and a cap formed over the piezoelectric layer.

19 Claims, 10 Drawing Sheets

PROTECTED RESONATOR

FIELD OF THE INVENTION

High-stability resonators and, more particularly, thin-film bulk acoustic wave resonators that are largely immune to environmental effects and aging are disclosed herein.

BACKGROUND OF THE INVENTION

The response of a bulk-acoustic wave resonator (FBARs, SMRs, HBARs, etc.) exhibits long term drift in its characteristics, particularly in frequency. This time-dependent long-term change is known as drift of the resonator. The drift is caused by both intrinsic and extrinsic factors and the intrinsic instability is often called as aging of the resonator. Aging occurs even when external environmental factors are kept constant. An example of an SMR structure from the prior art is illustrated in FIG. 1.

In the literature, Walls and Vig, "Fundamental Limits on the Frequency Stabilities of Crystal Oscillators," IEEE Transactions On Ultrasonics, Ferroelectrics, And Frequency Control, 42(4):576-589, July 1995 (referred to herein as Walls and Vig, 1995) and Vig and Meeker, "The Aging of Bulk Acoustic Wave Resonators, Filters, and Oscillators," Proc. 45$^{th}$ Ann. Symp. Frequency Control, IEEE Cat. No. 91 CH2965-2, pp. 77-101, (1991) (referred to herein as Vig and Meeker 1991) present a taxonomy of mechanisms that cause aging in resonators and oscillators. These mechanisms include mass transfer to or from the resonator's surfaces due to deposition or removal of contaminants, stress relief in the mounting structure of the crystal, changes in the electrodes, leaks in the package, and changes in the piezoelectric material. Other mechanisms include external environmental effects like temperature and stress cycling (hysteresis) and inertial effects.

In general, previous attempts in making a resonator stable against environmental effects and aging have focused on frequency stability. This effort has focused on packaging and mounting structure design.

Usually, packaging of the resonator has been the primary method of protecting it against aging that is caused by contamination and leaks. Also, packaging partially insulates the resonator from external environmental effects.

Quartz resonators have traditionally been packaged within containers to protect them from certain aging phenomena. Many examples exist in the prior art. For example, see U.S. Pat. No. 5,640,746 entitled "Method of Hermetically Encapsulating a Crystal Oscillator Using a Thermoplastic Shell" to Knecht et al. that issued on Jun. 24, 1997.

Micromachined thin film resonators are packaged using wafer-scale or device-scale encapsulation techniques. Many examples exist in the prior art. Micromachined thin film resonators like silicon resonators and thin-film bulk acoustic wave resonators (FBARs) use micromechanical support structures such as posts and suspensions. These structures are also designed to minimize the transfer of stress, including temperature-induced stress to the crystal resonator. For example, see Kim et al. "Frequency stability of wafer-scale film encapsulated silicon-based MEMS resonators," Sensors and Actuators A 136 (2007) 125-131. Also see U.S. Pat. No. 7,153,717 entitled "Encapsulation of MEMS Devices Using Pillar-Supported Caps" to Carley et al. that issued on Dec. 26, 2006.

The current methods of packaging are either high profile (the case with quartz), which makes them difficult to integrate in a product; or they encapsulate thin-film structures like released inertial resonators or FBARs that are susceptible to other forms of instability such as acceleration or shock.

The mounting structure is another location for possible aging. Stress introduced by packaging and transmitted to the crystal causes long-term frequency aging.

Quartz resonators have been mounted via support legs before being sealed under a cap. The support structure is carefully designed to minimize stress transfer (hence aging) to the crystal. Many examples exist in the prior art. For example, see U.S. Pat. No. 4,642,510 entitled "Mount for quartz crystal oscillator device" to Yamashita that issued on Feb. 10, 1987. See also U.S. Pat. No. 5,030,875 entitled "Sacrificial Quartz Crystal Mount" to Knecht, that issued on Jul. 9, 1991. Levitating the crystal using electrostatic levitation so that aging effects related to a mechanical mounting structure are minimized has also been suggested. See Wall and Vig, 1995.

The current methods of mounting of the resonator are susceptible to inertial and thermal fatigue, hence aging. None of these approaches, however, address the protection of the crystal and/or electrode material itself. The current approaches do not protect the crystal or electrode material from environmental effects, including aging.

The research focus to date on frequency stability is appropriate for certain applications. However, a more general focus on the entire behavior of the resonator around the primary resonance, in both frequency (f) and over time is desired.

SUMMARY OF THE INVENTION

The present invention is directed to a bulk acoustic wave resonator structure that isolates the core resonator from both environmental effects and aging effects. The structure protects against contamination, package leaks, and changes to the piezoelectric material due to external effects like ionizing radiation and package stress, while still providing excellent inertial resistance. In preferred embodiments of the present invention the structure has one or more protective elements that limit aging effects to at or below a specified threshold. That threshold is expressed herein as a shift in the impedance response of the resonator as a function of frequency that is at or below a certain value. As one skilled in the art will appreciate, an acoustic resonator device has an impedance value for each frequency value. As the resonator ages, the impedance value associated with a frequency value may change over time. Thus, the impedance value (Z) associated with a frequency f for the acoustic resonator as designed may change to the value $Z_i$ over time. The present invention limits the rate of the change of frequency to at or below a certain level.

More specifically, an acoustic resonator, when configured in an oscillator, oscillates at a frequency $f_{osc}$ that is associated with a complex-valued impedance Z=(Za, ZΦ). This complex-value impedance is initially determined when a value of a function g (Z) equals a specified design value $g_0$. Drift in the resonator behavior in its bandwidth occurs when the complex-valued impedance changes from the value associated with $g_0$. This drift manifests itself as shift in the oscillator frequency ($f_{osc}$) associated with the complex-valued impedance from the ($f_{osc}$) associated with the complex-valued impedance at $g_0$. The drift in $f_{osc}$ is expressed herein as a ppm change in frequency associated with a specific complex-value impedance per unit time. As used herein "ppm" is Hz on a MHz scale. That is, a change of 5 Hz is a 5 ppm change in an $f_{osc}$ of 1 MHz. The rate of change in $f_{osc}$ is at or below about 5 ppm/year.

In other embodiments, this drift can be measured as a change series or parallel resonance of the resonator. One skilled in the art will appreciate that, over the resonator bandwidth, the impedance response exhibits a minimum in amplitude that is associated with a particular frequency. The frequency associated with this minimum in amplitude is termed the series resonance. The frequency associated with the maximum in amplitude is the parallel resonance. The effects of aging also manifest themselves as a change in the frequencies associated with the series and parallel resonance. In these preferred embodiments, the shift in at least one of the series or parallel resonance frequency of the device is at or below about 5 ppm per year.

According to the embodiments described herein, mitigation of the effects that cause aging is more than simply minimizing frequency drift of the series or parallel resonance. For example, series resonance frequency depends on the acoustic path and any parasitics. Therefore the electromechanical coupling coefficient and dielectric constant of the resonator materials (and changes thereto over time) play no role in determining the series resonance frequency, and any subsequent drift in that frequency.

Consequently, in certain embodiments the resonator behavior is stabilized across the entire resonator bandwidth, not just at the series resonance. In order to achieve such stabilization, the electromechanical coupling coefficient and the dielectric constant of resonator materials must be stable over time. Embodiments of the present invention address short-term environmentally-driven instabilities as well as long-term aging effects on frequency drift. However, in certain preferred embodiments, the resonator behavior is stabilized such that the shift in the resonance frequency for at least one the series resonance and the parallel resonance is less than 5 ppm per year of device operation.

The resonator is protected from the effects of degradation of the material due to environmental and/or aging processes, by providing protective element that is a collar of material, in one particular embodiment a piezoelectric material, around the core resonator so that perimeter and edge-related environmental and aging phenomena are kept away from the core resonator.

In certain embodiments the resonator is protected against the effect of contamination on the surface by surrounding it on all sides by a protective element that is a plurality of energy-confining Bragg layers.

In certain embodiments the package and environmental stresses are attenuated and thereby prevented from reaching the main resonator structure. Attenuation is accomplished by providing a protective element that is one or more layers formed over and around the resonator function. These layers are Bragg layers, spacer layers, stress relief layers or sealing layers, or some combination thereof, as described more fully herein.

BRIEF DESCRIPTION OF THE DRAWINGS

For purposes of clarity and brevity, like elements and components will bear the same designations and numbering throughout the Figures.

DESCRIPTION OF THE PREFERRED EMBODIMENTS

Figure 1:
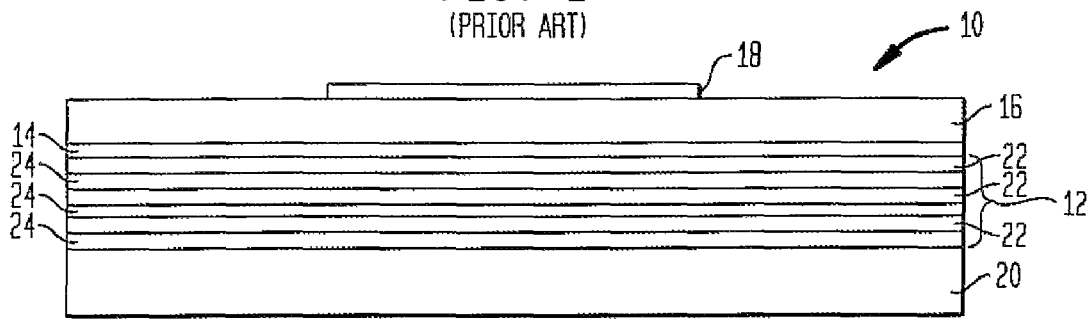
FIG. 1 is a cross section view of a thin-film solidly mounted prior art SMR (solidly mounted resonator)

FIG. 1 is a cross section view of a thin-film solidly mounted prior art SMR (solidly mounted resonator) 10. The SMR has a lower Bragg reflector 12, a lower electrode 14, a piezoelectric 16 layer, and an upper electrode 18. The lower Bragg reflector 12 has a plurality of pairs of high acoustic impedance layer 24 and low acoustic impedance layers 22. Each layer (22, 24) has a thickness approximately equal to an odd multiple of the quarter acoustic wavelength of the operational mode in the material. The operational mode is one of several resonant modes that are supported by the structure, and include the thickness-extensional mode, the thickness-shear mode, etc. For each of these modes, a resonant spectrum such as that shown in FIG. 2 can be realized. Selection of an odd multiple of the quarter acoustic wavelength thickness based on a particular mode results in maximum reflection of the perfect reflection of the acoustic energy in that mode. It is also possible to optimize the thickness to values different from the quarter wavelength thickness to obtain good reflection of acoustic energy in two or more different modes.

Figure 2:
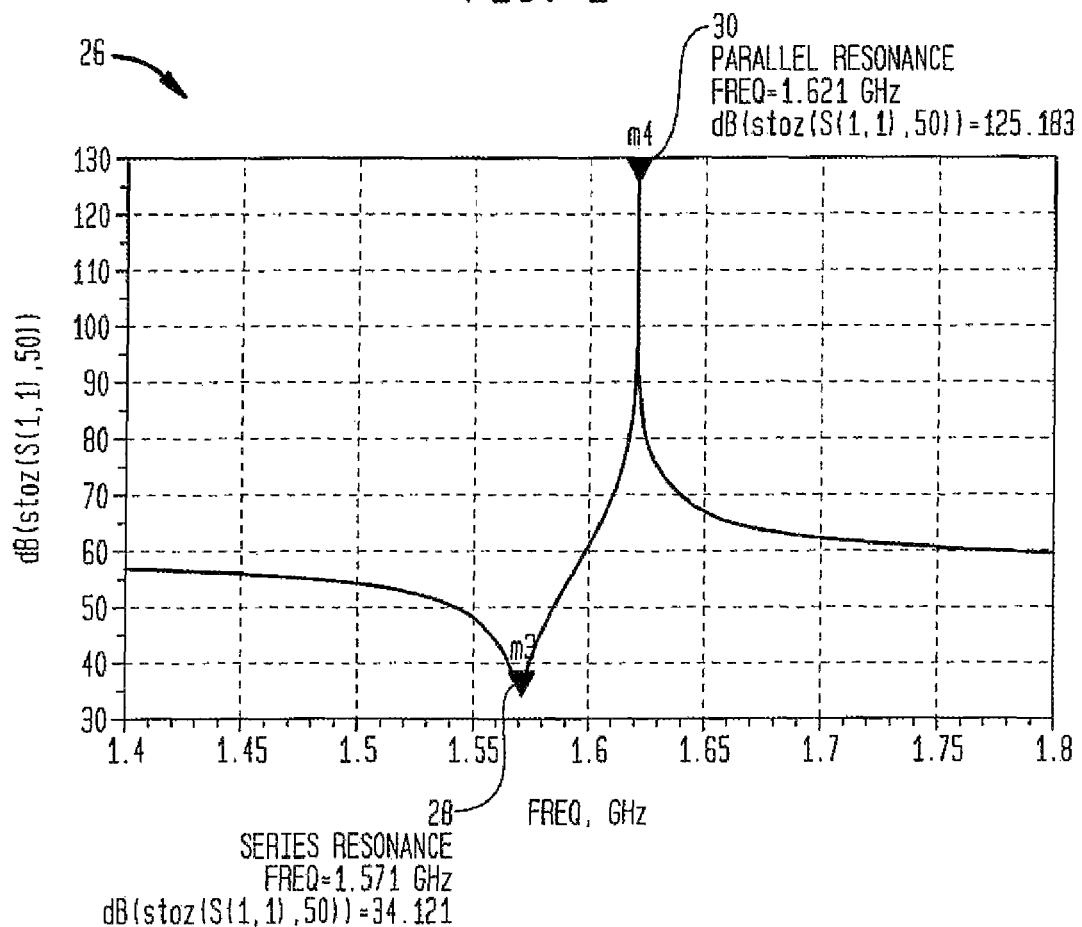
FIG. 2 is a frequency spectrum of an electrical impedance of a resonator.

Embodiments of the present invention reduce the drift of the impedance of the entire resonator around the primary resonance. The primary resonance, referring to FIG. 2, is the region of the spectrum from just before the series resonance 28 to just after the peak of the parallel resonance 30 of the device. The series resonance is typically defined as the frequency at which the impedance is a minimum. The parallel resonance is often defined as the frequency at which the impedance is at a maximum. The frequency range between the two is known as the bandwidth of the resonator.

Figure 3:
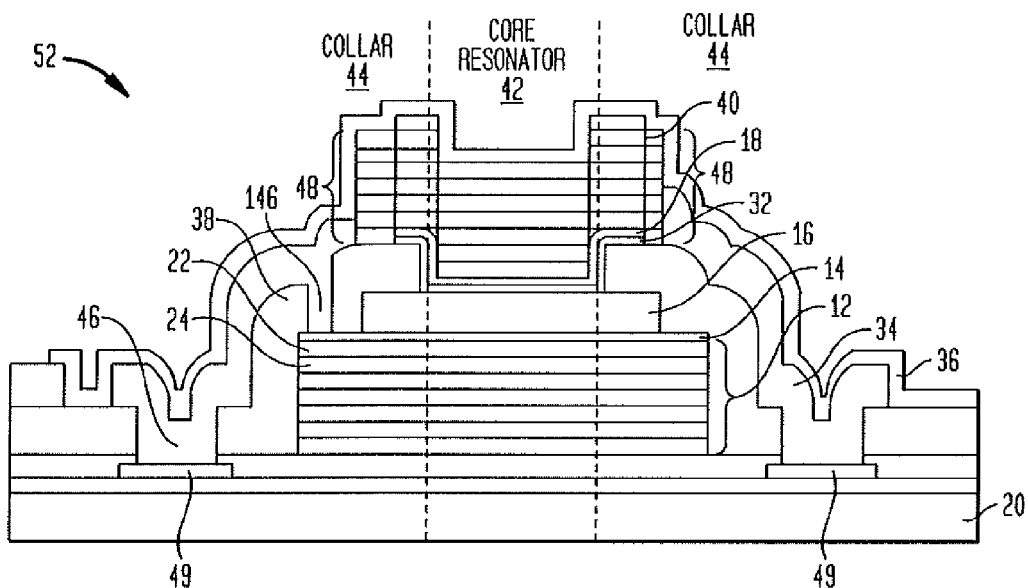
FIG. 3 is a cross section view of an alternative embodiment of the present invention with the core resonator surrounded by the collar.

Embodiments of the present invention provide a protective element that mitigates the drift in at least one of and preferably both, the series resonance and the parallel resonance over time. Preferred embodiments of the present invention have at least one of three features, collectively referred to as protective elements, which address several of the most important environmental effects and aging mechanisms that are the root cause of these undesirable shifts in series resonance and/or parallel resonance. One such embodiment is illustrated in FIG. 3. The first exemplary protective element is a collar 44 formed around the core resonator 42. The collar 44 as illustrated in FIG. 3 is a region surrounding the core resonator and includes layers of material that form the core region. For example, peripheral portions of the piezoelectric layer 16 extend into and are part of the collar 44. The collar 44 ensures that perimeter and edge-related environmental and aging phenomena are kept away from the core resonator 42.

The core resonator 42 is immune to the deposition of contaminants because it is surrounded on all sides by Bragg layers (22, 24). Such Bragg layers are described in previously cited U.S. patent application Ser. No. 12/002,524.

In an alternative embodiment (FIG. 4), the entire structure 52 is encapsulated in a protective element that is a low acoustic-impedance, low-density encapsulant 50 material such as aerogel. In this embodiment, the package and external stresses are not transmitted to the structure 52.

Referring again to FIG. 3, the cross section of 52 has a core resonator 42 surrounded by the collar 44. The structure 52 has an energy-confining Bragg reflector 48 both below (12) and above (40) the piezoelectric layer 16. The structure also has a lower electrode 14, a spacer 38 layer, an optional temperature compensating layer 32, an upper electrode 18, an optional interconnect 34 layer, and a passivation 36 layer. Each reflector has a plurality of pairs of high acoustic impedance layers 24 and low acoustic impedance layers 22. Each of these Bragg material layers (22, 24) has a thickness equal to an odd integer multiple of the quarter acoustic wavelength of the operational mode in the material. The spacer 38 layer can have a thickness equal to an odd integer multiple of the quarter acoustic wavelength of the operational mode in the material. The optional interconnect 34 layer electrically connects the resonator electrodes (14, 18) to pads (49) or to a via 46 down to CMOS circuits (not shown) in the substrate 20. The present invention contemplates both single-ended and differential embodiments. As used herein, a single-ended embodiment is one in which each of the top and bottom electrodes are electrically connected to a circuit. A differential embodiment, both of the electrodes that go to circuits are located on one side of the device. The electrode on the other side is left floating.

The structure illustrated in FIG. 3 is formed in the following illustrative manner. The layered structure 52 is formed on substrate 20 by depositing and patterning layers of material as follows. Layers are deposited to form a lower Bragg reflector 12 (formed from alternating high 24 and low 22 acoustic impedance layers) and a lower electrode 14. The piezoelectric 16 material is deposited on the lower electrode 14. The piezoelectric 16 material is patterned by photolithography and etching. Then, the electrode 14 and, in some cases, the reflector 12 are also patterned by photolithography followed by one or more etch steps. An insulating spacer 38 layer is then deposited and patterned, thereby removing spacer material from over the portion of the piezoelectric 16 material from the core resonator region 42 where the device will be formed. The spacer layer therefore defines the core and collar regions in this embodiment. An upper electrode 18 is formed over the exposed region of the piezoelectric 16 material to create the active portion of the device. In products where integration of resonators on a substrate having CMOS devices is desired, ohmic contact to the lower electrode 14 is provided. In the illustrated embodiment vias 46 and 146 are formed in the insulating spacer layer 38 down to CMOS circuits (for via 46) and down the lower electrode 14 (for via 146) by photolithography and etching. A conducting interconnect 34 is then formed to electrically connect the electrodes 14 and 18 to the CMOS devices formed in the substrate as required. The energy-confining Bragg reflector layers 22 and 24 that form the upper Bragg structure are then deposited in sequence and, subsequently, patterned. Preferably such patterning will provide access to the interconnect layer 34 for subsequent packaging. A sealing layer 36 is then formed over the structure to further protect and isolated the active structure from the environment and the effects thereof. Layer 36 is referred to as a passivation layer or sealing layer herein. Examples of materials suitable for use as a passivation or sealing layer include silicon nitride, polyimide, or benzocyclobutene (BCB).

Figure 4:
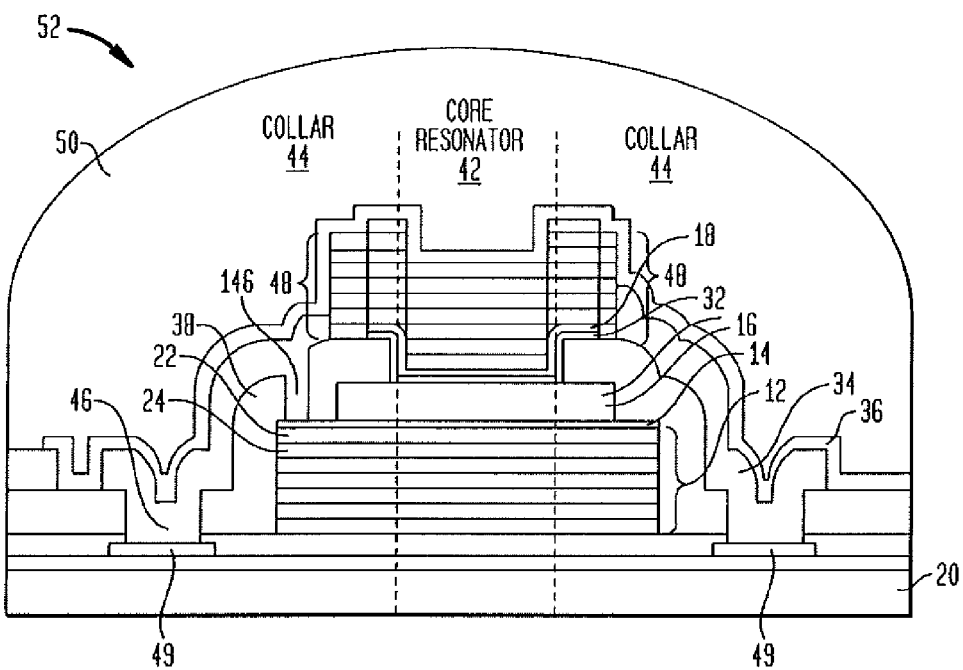
FIG. 4 is a cross section view of alternative embodiment with the core resonator surrounded by the collar.

FIG. 4 is a cross section view of a preferred embodiment of the present invention again having the structure 52 having the core resonator 42 surrounded by the protective element collar 44. A protective element that is a low-acoustic impedance material 50 is placed over the entire structure 52. This material encapsulates the device and attenuates the transmission of external and package stress to the device. As with the embodiment illustrated in FIG. 3, this embodiment can also be single-ended or differential. To further reduce the transmission of package stresses that will change over time, an additional layer of soft material such as an encapsulation resin (e.g. silicone) commonly known as "glop top" may be deposited over the resonator after it is assembled into a package and before overmolding of the package with plastic. Encapsulation resins are well known to one skilled in the art and are not described in detail herein.

The material formed over structure 52 is a low-density, low-acoustic impedance encapsulant 50 material such as aerogel. Layer 50 is deposited on structure 52 before plastic packaging. Layer 52 ensures that external and package stresses are not transmitted to the core resonator structure 42.

As previously noted, the collar 44 around the core resonator 42 illustrated in FIGS. 3 and 4 isolates the core resonator 42 from most environmental effects. The collar attenuates temperature, stress or aging effects before they reach the core resonator 42. Although applicants do not wish to be held to a particular theory, applicants believe that the collar 44 acts like a parasitic resonator on the core resonator 42. Advantageously, the size of the parasitic resonance can be customized during device design to meet product performance requirements.

Also as previously noted, the use of energy-confining Bragg reflector 48 is a protective element that isolates the core resonator 42 from external contaminants released by the environment, as well as providing additional shielding for the core resonator 42 against temperature and/or stress effects. Protective element 50 is a stress barrier that protects the core resonator from external sources (e.g., the package, the environment) to prevent these stresses from propagating to the core resonator 42.

The spacer 38 is another protective element that is also used to electrically isolate the lower electrode 14 from the upper electrode 18 in addition to providing extra material in the collar 44 region to attenuate environmental effects. In this regard it is advantageous if the spacer layer 38 is a dielectric material (e.g., silicon dioxide). In a preferred embodiment the spacer 38 layer thickness is approximately equal to an odd integer multiple of the Bragg wavelength in the material. Bragg wavelength is defined by the following equation:

$$v = v(c33/d) \tag{1}$$

where v is the acoustic velocity in the material, c33 is the stiffness coefficient of the material in the direction of wave propagation, and d is the material density. The layer thickness is calculated by the following equation:

$$t = N \times (v/f)/4 \tag{2}$$

where t is the layer thickness and f is the Bragg center frequency. N is an odd integer $\geq 1$.

Figure 14:
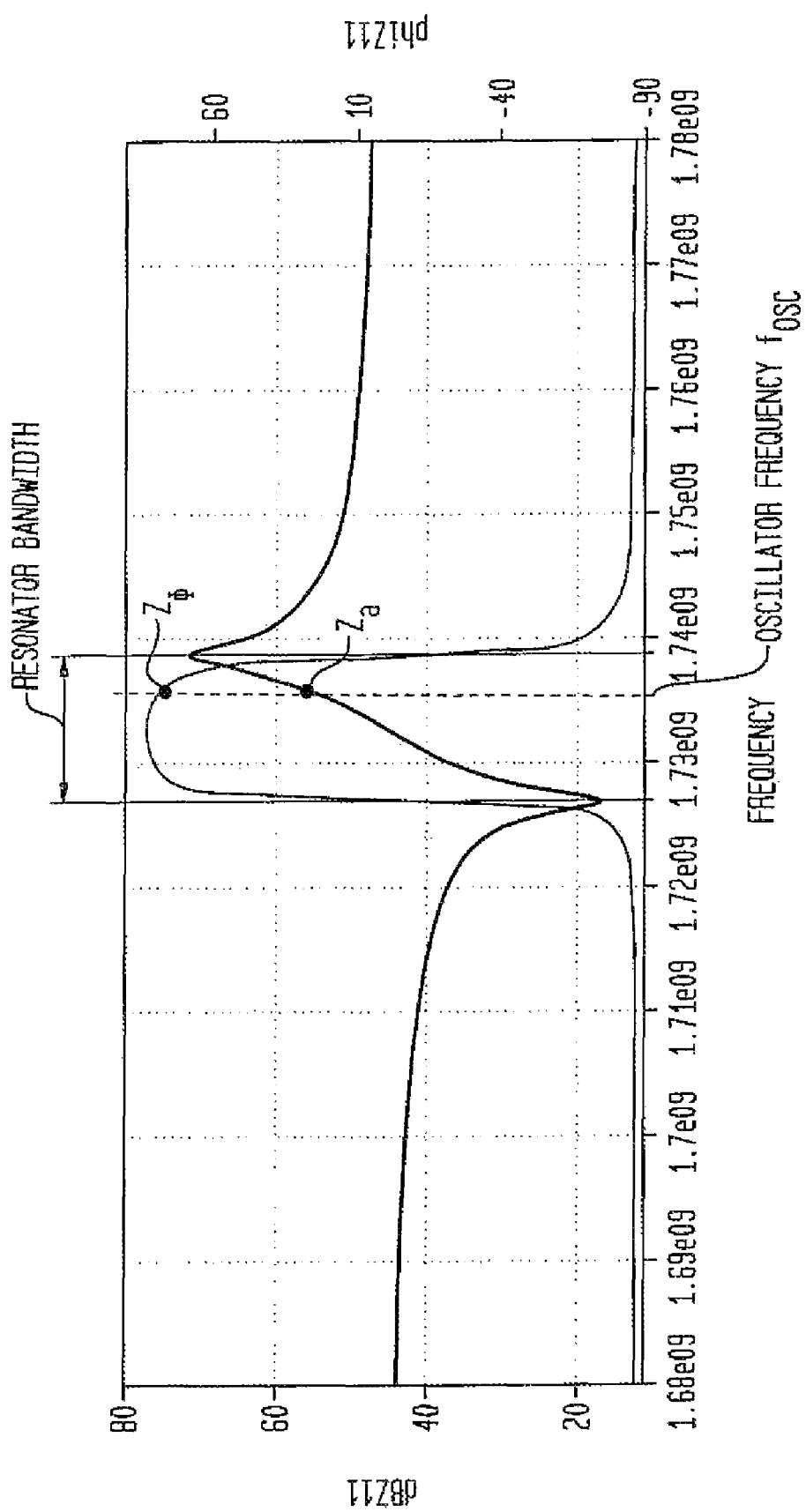
FIG. 14 illustrates the complex impedance response of a resonator as a function of $f_{osc}$.

Referring to FIG. 14, the impedance response for an oscillator is illustrated as a function of $f_{osc}$. The impedance response is illustrated for an oscillator type resonator device. The device oscillates at a frequency $f_{osc}$ that is determined by the complex-valued impedance $Z=(Za, Z\Phi)$. This impedance value is determined when a value of a function g(Z) equals a specified design value $g_0$. Drift in the resonator behavior in its bandwidth results in a drift in the value of $f_{osc}$ where resonator impedance becomes equal to $(Za, Z\Phi)$. The drift in $f_{osc}$ can be quantified in ppm/time. According to the present invention, aging effects are controlled so that the change in frequency associated with a complex-valued impedance $Z=(Za, Z\Phi)$ changes at a rate of 5 ppm/per year or less.

Figure 5:
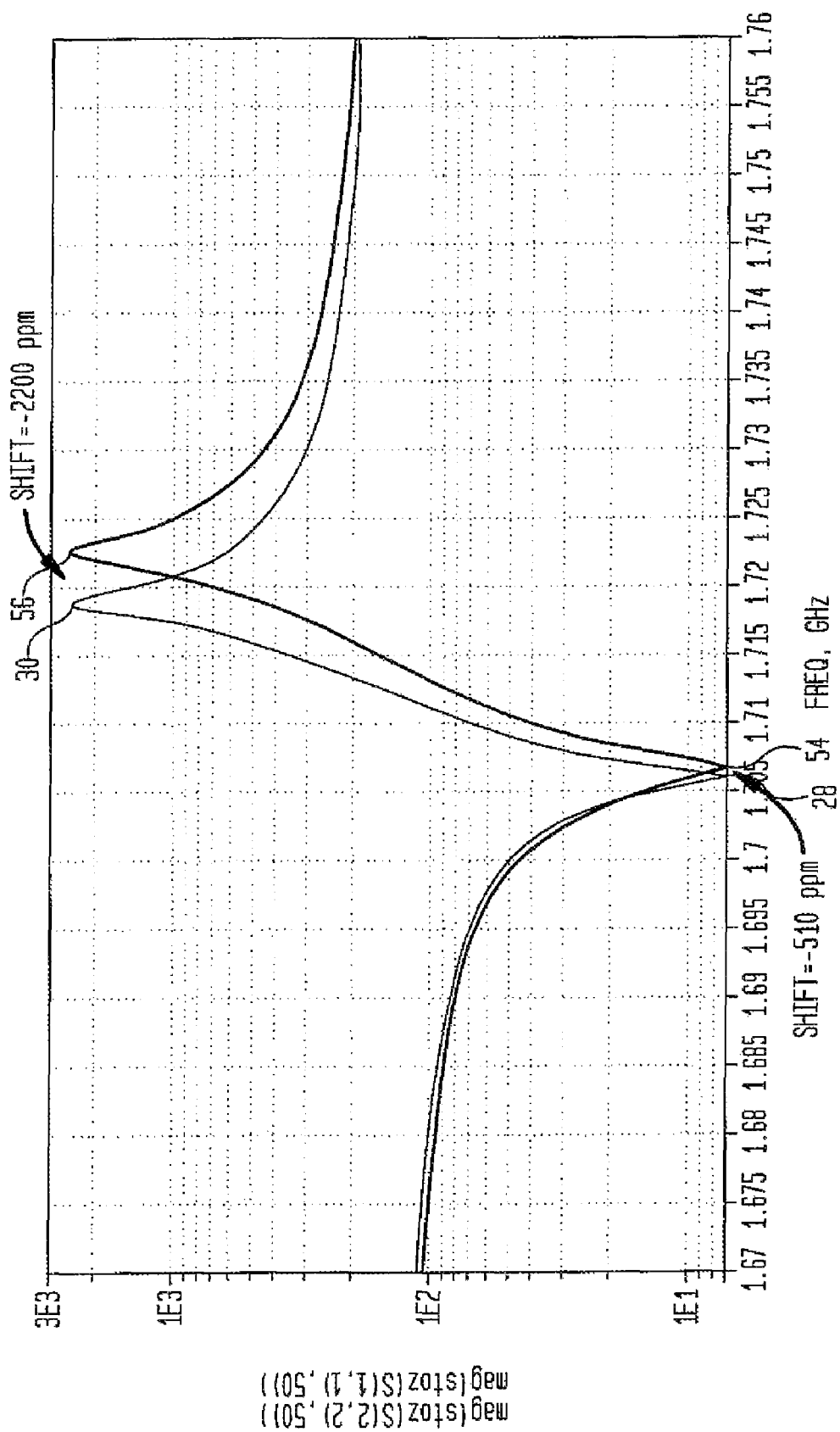
FIG. 5 is a frequency spectrum view of a prior art SMR (FIG. 1)

External stress and/or ionizing radiation are examples of environmental conditions that can change material properties of the resonator. Piezoelectric 16 properties, in particular, are susceptible to change due to external factors. FIG. 5 illustrates the resonance spectrum of an SMR from the prior art (the SMR illustrated in FIG. 1). As noted above, ionizing radiation or other external process can change the material structure of the resonator layers, and hence their electromechanical properties. These changes manifest themselves as a change or shift in the resonator spectrum. When there is a 10% decrease in the piezoelectric 16 coupling coefficient in an SMR such as the one shown in FIG. 1, there is a large shift in the resonance spectrum. The FIG. 1 structure has 3.5 pairs of tungsten/oxide Bragg reflector layers, an AlN (aluminum nitride) piezoelectric layer 16 and molybdenum (MO) electrodes (14, 18). The series and parallel resonance was modeled over time for this structure using a 1-D acoustical and 3-D electrical model implemented in Agilent Advanced Design System (ADS) 2006. For the prior art structure illustrated in FIG. 1, the effect of a 10% decrease in the coupling coefficient on the resonance spectrum was modeled. For this FIG. 1 structure, FIG. 5 illustrates that there is a −510 ppm (i.e. an 870, 570 Hz shift downward) shift in the series resonance 54, and a −2200 ppm (i.e. a 3,790,600 Hz shift downward) shift in the parallel resonance 56 as illustrated in FIG. 5. The greater decrease of the parallel resonance 30 compared to the series resonance 28 results in a lowered k2 or bandwidth for the resonator. For many applications, such a shift in behavior can severely and negatively impact performance.

Figure 6:
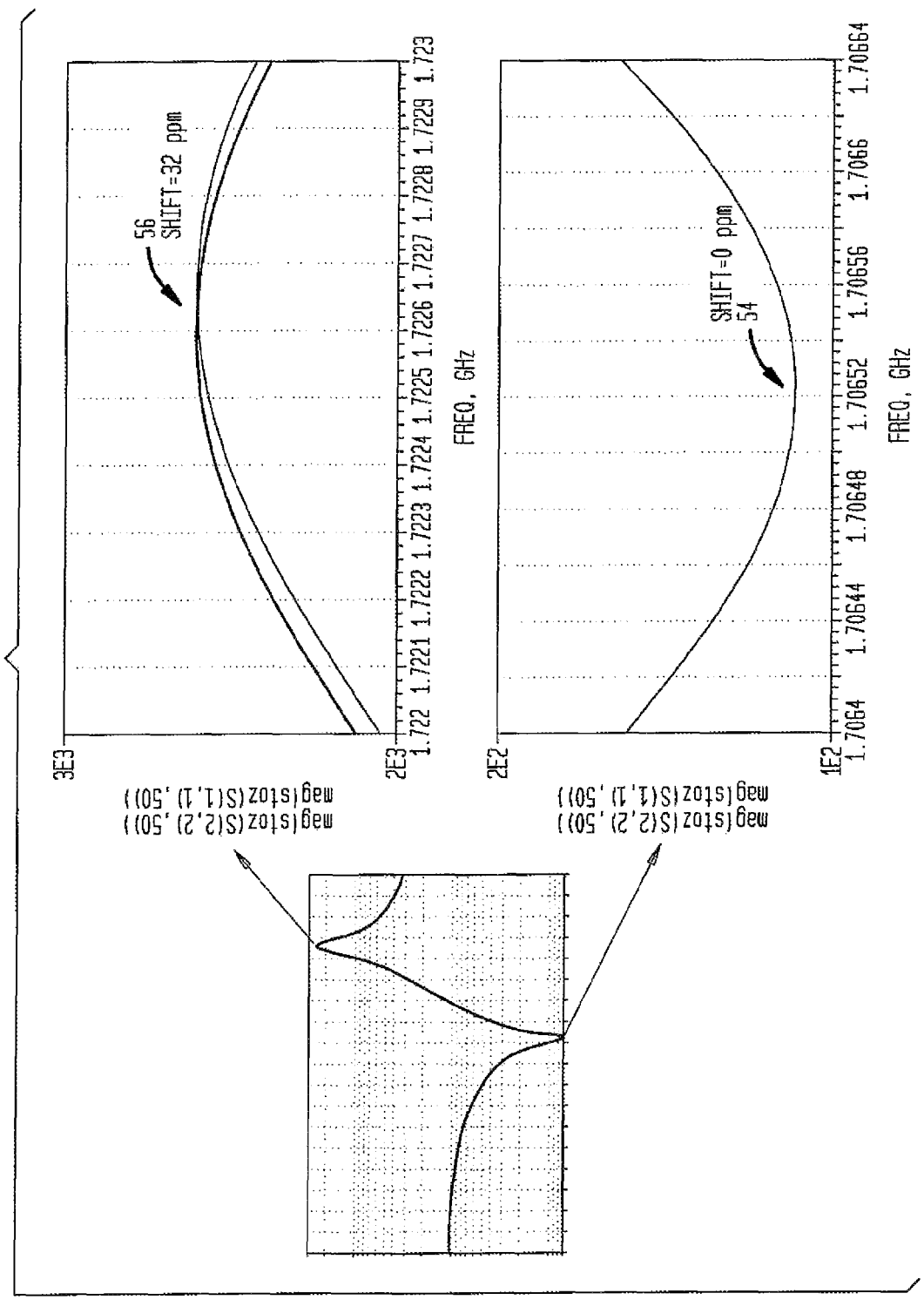
FIG. 6 is a frequency spectrum view of an alternative embodiment.

FIG. 6 illustrates a frequency spectrum view of the structure 52 (e.g., FIGS. 3 and 4) with the same materials from the prior art example of FIG. 5 for the Bragg layers, piezoelectric layer and electrodes, but with a 10% decrease in the piezoelectric 16 coupling of the collar 44 material. This change, caused by the same environmental condition that caused the shift illustrated in FIG. 5, results in a negligible shift in the resonance spectrum, with a +32 ppm shift in the parallel resonance 56 (i.e. a 54, 624 Hz shift upward), and 0 ppm shift (no shift) in the series resonance 28. The reason for the difference observed in effect of the coupling coefficient on the frequency shift of the two devices is that, in the device in FIGS. 3 and 4, the change in coupling coefficient of the piezoelectric material was largely confined to the collar region 42. The piezoelectric material in the core resonator 44 had very little change in coupling coefficient.

In the example illustrated in FIG. 6, the shift of the resonance is barely visible in a narrow band frequency sweep. A very narrow band sweep reveals that there is negligible shift in the parallel resonance 56 and no shift in the series resonance 28. This illustrates the ability of the structure described herein to protect the core resonator 42 by providing a collar 44 that mitigates adverse effects of the environment on material properties without affecting the performance of the core resonator 42.

Figure 7:
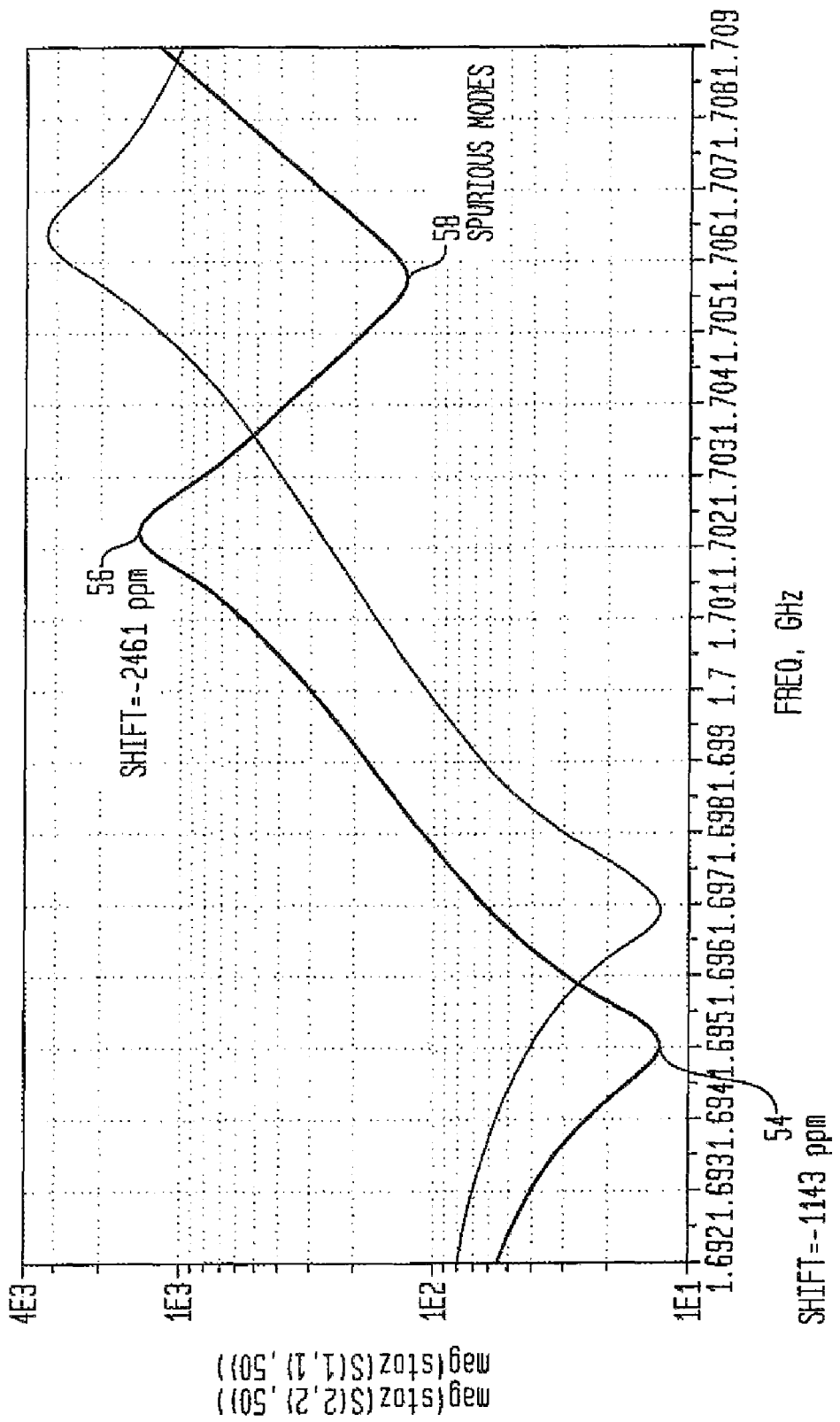
FIG. 7 is a frequency spectrum view of a prior art SMR (FIG. 1) with the same material as the SMR in FIG. 5.

FIG. 7 is a frequency spectrum view of the SMR of FIG. 1 using the same materials as those identified in the discussion of FIG. 5. FIG. 7 illustrates the shift in the resonance spectrum of an SMR due to a 0.1 um thick layer of oxide contaminant on the top surface of the device (piezoelectric layer 16 in FIG. 1). The series and parallel resonance was modeled over time for this structure using the software tools previously described. For the prior art structure illustrated in FIG. 1, as an example of the physical effects of aging in one scenario, a 0.1 um thick layer of oxide contaminant on the top surface of the device is expected to form over the first year of use. Contaminants can be any material, deposited at any rate over some time period. This was just used to illustrate the concept and the benefit of the upper bragg. This causes a −1143 ppm shift in the series resonance (i.e. a 1,939,671 Hz shift downward) 54 and a −2461 ppm shift in the parallel resonance 56 (i.e. a 4,199,697 Hz shift downward). Additionally, a spurious mode 58 is introduced adjacent to the main resonance in the spectrum.

FIG. 7 illustrates the large changes that occur in the resonator response as a result of the deposition of contaminants on the structure. The large negative shift in the series resonance 54 and the even larger negative shift in the parallel resonance 56 results in a lowered k2 or bandwidth for the resonator. Additionally, a spurious mode 58 is introduced near the main resonance, further altering the behavior from the baseline. For many applications, such a shift in performance is unacceptable.

Figure 8:
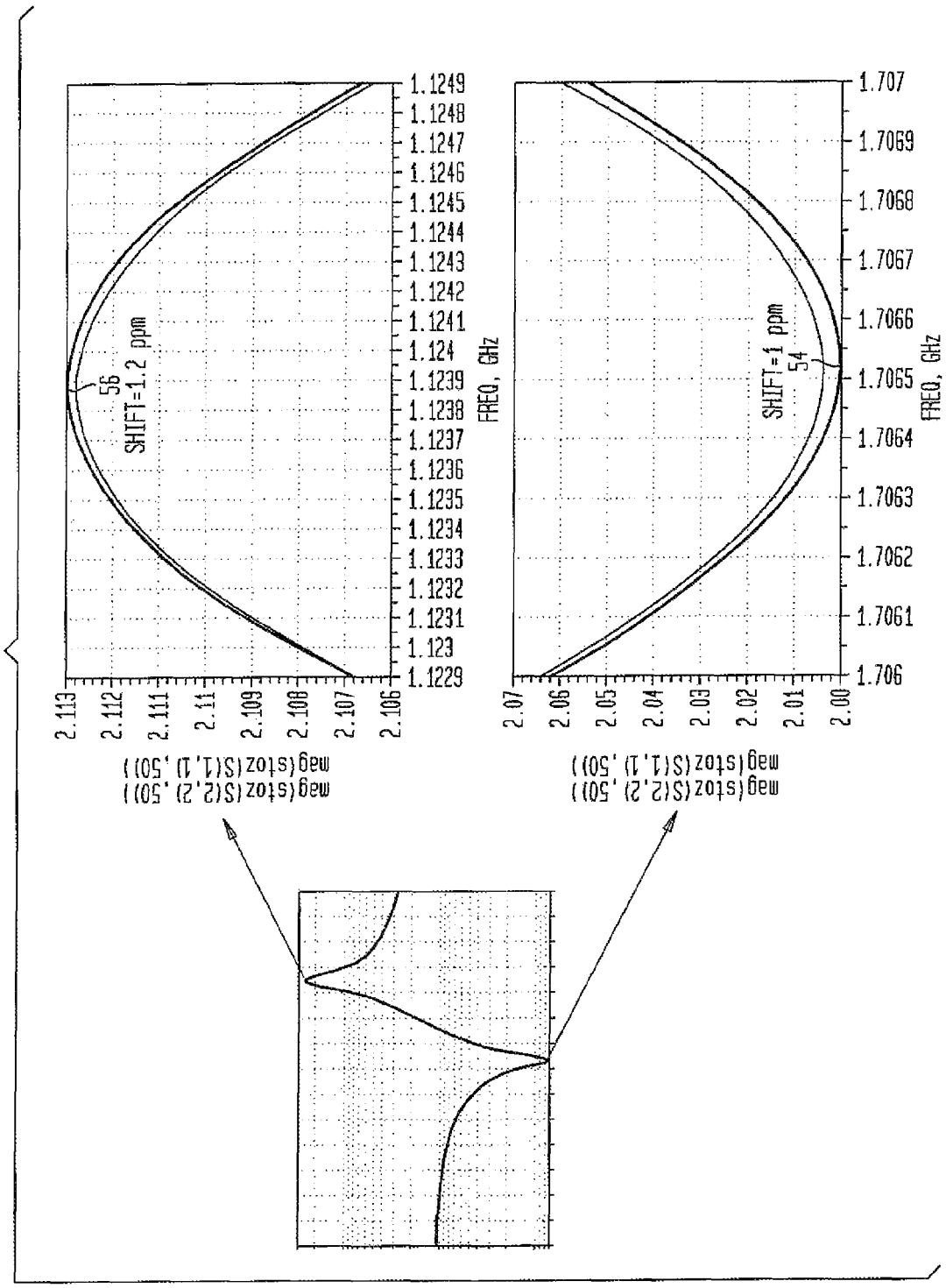
FIG. 8 is a frequency spectrum view of an alternative embodiment with the same materials from the SMR of FIG. 5.

FIG. 8 is a frequency spectrum view for the structure 52, made from the same materials set forth in the description of FIG. 5. The structure has a 0.1 um thick layer of oxide contaminant on the top surface of the device. Contrary to the shift in spectrum caused by this layer on prior art devices, the oxide contaminant causes a negligible shift in the resonance spectrum of the device with structure 52.

Specifically, when the structure 52 is subjected to the same environmental contaminant effect as the FIG. 1 prior art structure, the shift of the resonance is barely visible in a narrow band frequency sweep. As illustrated in FIG. 8, there is a +1 ppm shift in the series resonance 54 (i.e. a 1,697 Hz shift upward), and +1.2 ppm shift in the parallel resonance 56 (i.e. a 2,047.8 Hz shift upward). This illustrates that the resonator is protected by the energy-confining Bragg structure that attenuates the acoustic and electrical effect of contaminants that deposit on the device surface.

Introducing an aerogel-like encapsulant 50 around the device (FIG. 4) as an additional protective element further attenuates package stresses and inertial stresses by making them more remote from the resonator device.

Figure 9:
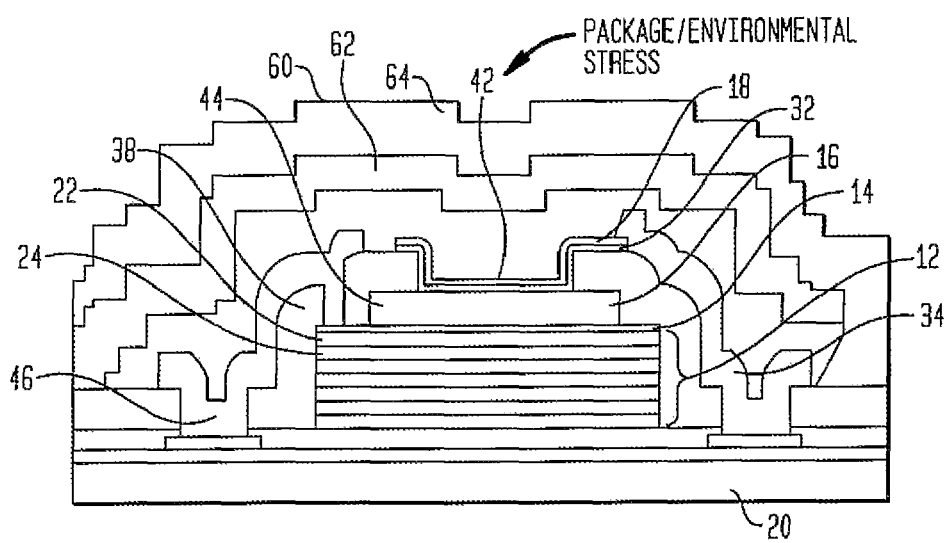
FIG. 9 is a cross section view of an alternative embodiment with the core resonator surrounded by the collar.

FIG. 9 is another embodiment of the present invention. This embodiment is also configured to protect the resonator from external stresses. An SMR structure is equipped with a protective element collar 44 as previously described. The resulting structure is then covered with another protective element. That protective element is a device-level thin-film cap 60 structure that can attenuate package stress as well as isolate the resonator from the effects of contaminants. In this structure, the stress management function of the structure is separated from the acoustic resonator function.

The structure in FIG. 9 is fabricated in the following sequence. A lower Bragg reflector 12 (alternating high 24 and low 22 acoustic impedance layers) is formed by depositing a plurality of alternating layers 22 and 24 on substrate 20. A lower electrode 14 and piezoelectric 16 material layer are deposited on the Bragg reflector 12. The piezoelectric 16 material is patterned by photolithography and etching. Then, the electrode 14 and, in some embodiments, the reflector 12 are patterned by photolithography and one or more etch steps. An insulating spacer 38 layer is then deposited and patterned, to remove it from the portion of the piezoelectric 16 material in region 42. An upper electrode 18 is formed over the exposed region of the piezoelectric material 16 to create the active portion of the device. In products where integration of resonators with CMOS devices is desired, (therefore requiring ohmic contact to the lower electrode 14), a via 46 is formed in the insulating layer to the lower electrode 14 by photolithography and etching. A conducting interconnect layer 34 is formed for electrical connection to each of the electrodes. Up to this point, the manufacturing process follows that described for the embodiments illustrated in FIGS. 3 and 4.

The protective element cap 60 structure is formed over the above-described structure by first depositing a sacrificial layer over the structure, forming the cap 60 structure thereover and then patterning the structure to remove the sacrificial layer. The resulting space houses a vacuum or a noble gas in the completed device. Sacrificial layers may be made out of any material that can use underlying exposed material as an etch stop. Silicon is one example of a suitable sacrificial material. The cap layer as illustrated is a two layer structure; an inner protective layer 62 and an outer seal layer 64. An inner protective layer 62 is deposited over the above described sacrificial layer. The sacrificial layer has vias formed therein that are filled with the protective layer material when the protective layer is formed on the sacrificial layer. Since these vias are filled with the protective layer material, the protective layer material remains when the sacrificial layer is removed. The inner protective layer is patterned such that it remains over the device region 42, anchored to the substrate 20 by the protective layer material that remains after the sacrificial layer is removed. The sacrificial layers are then completely etched away, leaving the device and the protective layer 62 as freestanding, released structures. This is observed by the gap 63 between the device structure and the protective layer 62. A seal layer 64 is deposited over the structure encapsulating the device beneath the cap 60. Layer 62 can be any structurally stiff material such as alumina, silicon nitride, gold, etc. In certain embodiments, layer 62 is configured as a Bragg structure such as previously described. Layer 64 can be a material that provides a hermetic seal to the underlying structure. Alumina and silicon nitride are examples of suitable materials.

FIG. 9 is a cross section view of the alternate embodiment 66 described above with the core resonator 42 surrounded by the collar 44. Structure 66 has a lower Bragg reflector 12, a lower electrode 14, a piezoelectric 16 layer, a spacer 38 layer, an optional temperature compensating layer 32, an upper electrode 18, and an optional interconnect 34 layer. The Bragg reflector 12 has alternating layers of high acoustic impedance layer 24 and low acoustic impedance layer 22. The Bragg reflector has a plurality of pairs of these layers. Each of these material layers has a thickness equal to a quarter acoustic wavelength of the operational mode in the material. The cap 60 that is formed over the resonator structure has an inner protective layer 62 and an over seal layer 64. As with the other embodiments described herein, the structure in FIG. 9 can be single-ended or differential.

Figure 10:
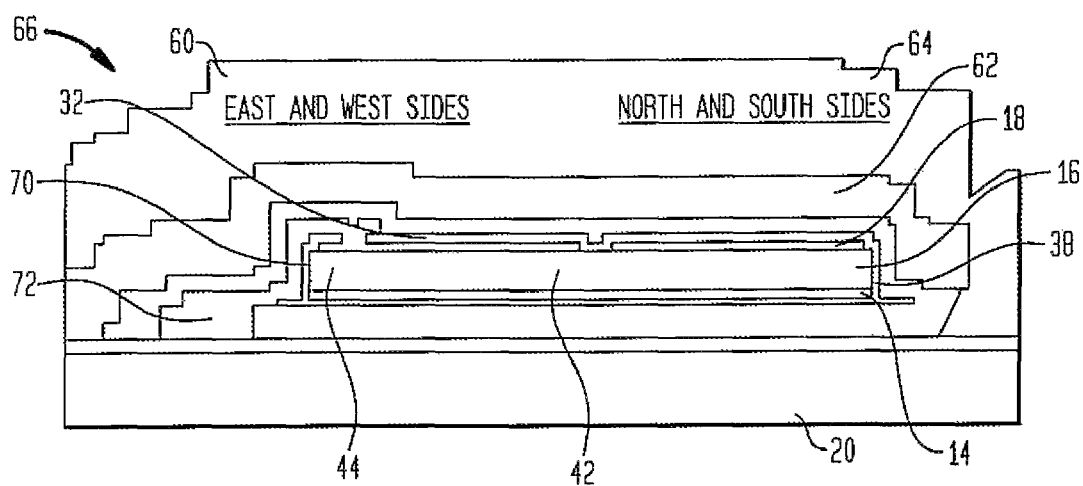
FIG. 10 is a cross section view of another alternate embodiment in a FBAR configuration with a core resonator, a collar and a spacer, under a cap.
Figure 11:
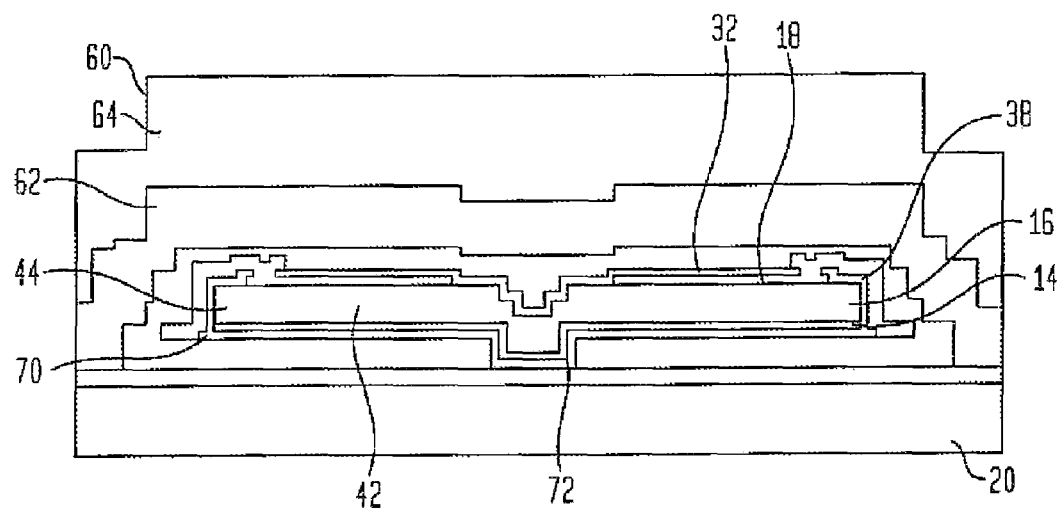
FIG. 11 is a cross section view of an alternate embodiment in a FBAR configuration with a core resonator, a collar and spacer, under a cap, where the FBAR is supported at the center of the structure.

For certain applications, stresses originating from the wafer itself are significant enough to justify released (FBAR) structure even though these structures exhibit decreased inertial resistance. FIGS. 10 and 11 illustrate another alternate embodiment 66. The released FBARs have the collar 44 and spacer 38 that protect the core resonator 42. The FBARs are covered with a cap 60 structure as described above for FIG. 9.

The structures illustrated in FIGS. 10 and 11 are formed as follows. A sacrificial release layer is deposited and patterned such that it remains under the device region 42. On the substrate 20 is formed a temperature compensating layer 32, lower electrode 14, piezoelectric 16 material, and upper electrode 18. The upper electrode 18 is patterned by photolithography and etching. The piezoelectric 16 material, the lower electrode 14, and the temperature compensation layer are all patterned (preferably with the same mask) using photolithography and a sequence of etches. A second temperature compensation layer 32 is deposited and patterned, sealing both regions 42 and 44 of the device except electrical interconnects to the upper electrode 18. A conductive layer 70 is then deposited and patterned that electrically connects the device and mechanically supports the structure after release.

The cap 60 structure is formed over the above structure. A second sacrificial layer (not shown) is deposited and patterned. An inner protective layer 62 is deposited and patterned such that it remains over the device region, anchored to the substrate 20 through holes in the second sacrificial layer only. The sacrificial layers are etched away, leaving the device and the protective layer as freestanding, released structures. A seal layer 64 is deposited, encapsulating the device beneath the protective membrane.

Referring to FIG. 10, the structure has a core resonator 42, a collar 44 and a spacer 38, under a cap 60. The structure 66 has a lower electrode 14, a piezoelectric 16 layer, a spacer 38 layer, an optional temperature compensating layer 32, an upper electrode 18, and an interconnect layer 70. The interconnect 70 layer is also a suspension support. The suspension 70 supports the FBAR and is connected to the substrate 20 by the anchor 72. The interconnect/suspension 70 is made of a metal such as aluminum or copper. In situations when the resonator is built directly on top of a previously fabricated circuit wafer, the anchor 72 material is also a metal, to facilitate interconnect with underlying circuitry. The cap 60 formed over the resonator structure consists of an inner protective layer 62 and a seal layer 64.

FIG. 11 shows a variant of the FBAR embodiment illustrated in FIG. 10 where the FBAR is supported by a center post 72 instead of side supports. The advantage of this embodiment is that temperature-related stresses and other environmental effects (one of the major reasons for device aging) do not introduce changes in the FBAR performance. This is because the mismatch in the temperature coefficient of the different materials in the resonator structure, in particular the piezoelectric and the oxides cannot cause stress at the material interfaces.

FIG. 11 is a cross section view of this alternate center post embodiment. FIG. 11 illustrates a core resonator 42, a collar 44, and spacer 38, formed under a cap 60, where the FBAR is supported at the center of the structure. The structure has a lower electrode 14, a piezoelectric 16 layer, a spacer 38 layer, an optional temperature compensating layer 32, an upper electrode 18, and an interconnect (not shown) layer. The upper electrode 18 and the interconnect 34 layer form the suspension 70 in the illustrated embodiment. The suspension 70 supports the FBAR and is connected to the substrate 20 by the anchor 72. Substrate 20 has a barrier layer 78 formed thereon. The barrier layer is any suitable material such as, for example, silicon nitride. The cap 60 is formed over the resonator structure. The cap 60 has an inner protective layer 62 and a seal layer 64.

Figure 13:
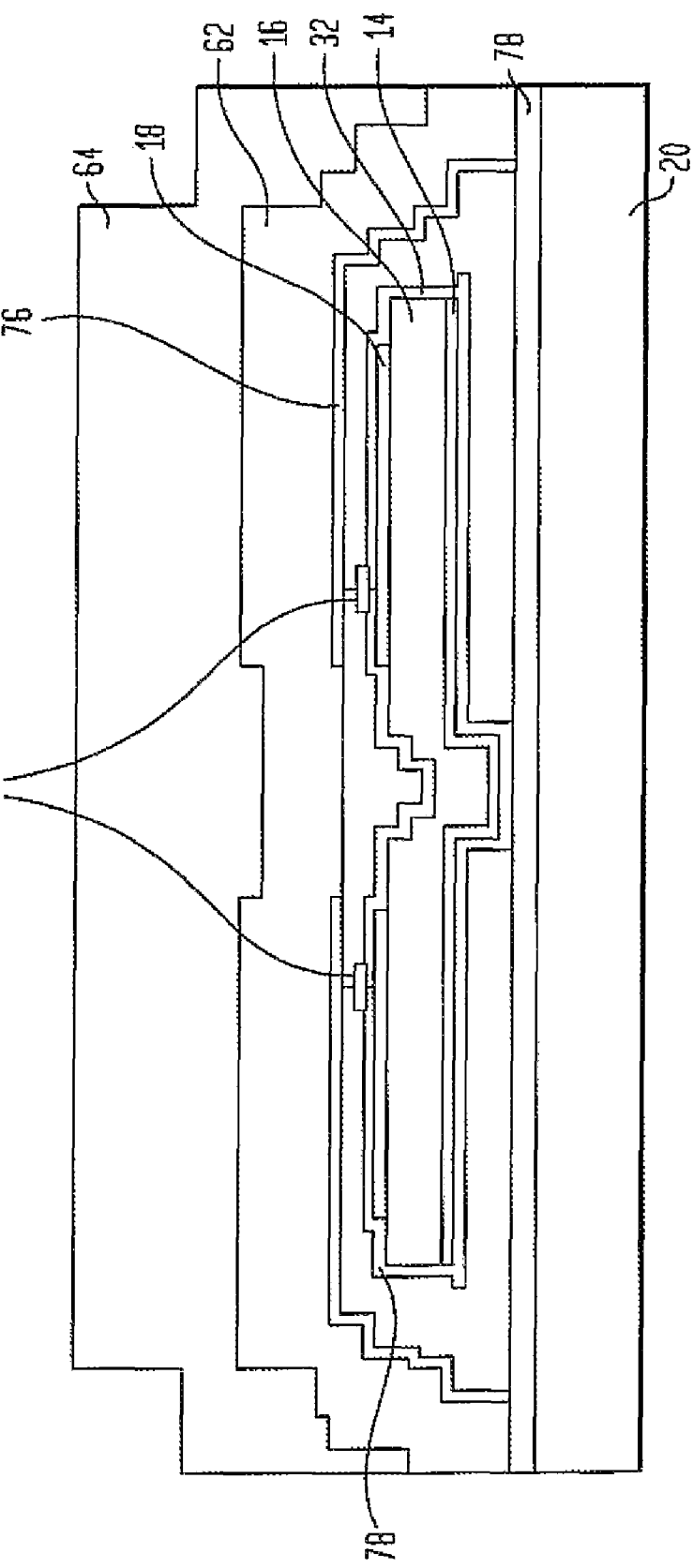
FIG. 13 is a cross section view of an alternate embodiment with an inverted SMR configuration having a core resonator and a collar and encapsulated under a cap that is constructed as a Bragg reflector with an alternative electrode configuration.

An alternative FBAR configuration is illustrated in FIG. 13. In this embodiment, an interconnect 76 is disposed underneath the cap 60, and specifically under the protective layer 62 of the cap 60. In this embodiment the top electrode 18 is capacitively or inductively coupled to the interconnect 76 disposed underneath the cap. An alternative configuration is not illustrated where the interconnect 76 is disposed on the barrier layer 78. In this configuration, the bottom electrode 14 is capacitively or inductively coupled to the interconnect 76. Therefore, the bottom electrode 14 is the two part electrode in this alternative configuration. The top electrode in the alternative configuration is one part (as the bottom electrode 14 illustrated in FIG. 13). The interconnect is also in two parts in this alternate configuration, one part each being disposed on either side of the temperature compensating layer disposed on the barrier layer. The advantage of this structure is that neither the bottom electrode 14 nor the top electrode is performing a support function. Therefore degradation in their mechanical properties due to environmental effects or aging have no effect on resonator performance.

Figure 12:
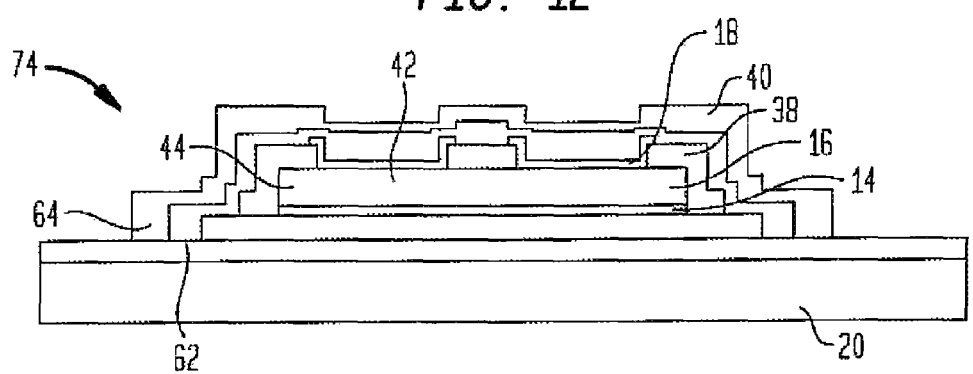
FIG. 12 is a cross section view of an alternate embodiment with an inverted SMR configuration having a core resonator and a collar and encapsulated under a cap that is constructed as a Bragg reflector.

FIG. 12 is a cross section view of an alternate embodiment 74. This embodiment is an inverted SMR with a core resonator 42, collar 44, both of which are encapsulated under a cap 40 that is constructed as a Bragg reflector. The structure 74 has a lower electrode 14, a piezoelectric 16 layer, and an upper electrode 18. A temperature-compensating layer is optional and not illustrated. The cap 40 formed over the resonator structure consists of an inner protective layer 62 and a seal layer 64. The seal layer 64 is configured as an energy-confining upper Bragg reflector. As previously described such a layer has multiple pairs of layers, each pair having a high acoustic impedance layer 24 and low acoustic impedance layer 22. As described above, each of these materials has a thickness equal to a quarter acoustic wavelength of the operational mode in the material. Individual reflector layers are not shown but illustrated as one monolithic layer 40. As with other embodiments, this embodiment can be single-ended or differential.

This embodiment can be thought of as an inverted SMR hanging from the cap 40, with cap 40 constructed as a Bragg reflector. There is no lower Bragg reflector (e.g. 12 in the structure illustrated in FIG. 9); instead there is a cavity 80 created when a sacrificial layer is etched away by a release process.

For products that require extremely low-profile packaging, the aerogel-like encapsulant material in other embodiments may not be suitable. For other products that require a high degree of inertial shock resistance, a released FBAR structure may be unsuitable. The cap 40 is able to protect the device 42 from package and external stress while still providing an extremely low-profile. Since the resonator is a part of the cap 40, it benefits from the mechanical strength of the cap 40 while still being acoustically isolated from the environment by the Bragg reflector characteristic of the cap 40.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

The invention claimed is:

1. A resonator comprising:
   a substrate;
   a piezoelectric layer formed over said substrate at least a portion of the piezoelectric layer being disposed between two electrodes; the piezoelectric layer having two defined regions, an active interior region and a perimeter collar region;
   a Bragg structure formed either above the piezoelectric layer, below the piezoelectric layer or both above and below the piezoelectric layer wherein the Bragg structure has a lateral extent that is at least coextensive with the piezoelectric layer; and
   a dielectric spacer that defines the lateral extent of the active interior region.

2. The resonator of claim 1 wherein the spacer is adjacent the perimeter of the piezoelectric layer.

3. The resonator of claim 2 wherein a window is formed in the spacer that terminates on the bottom electrode.

4. The resonator of claim 3 wherein an electrically conductive material is disposed in the window.

5. The resonator of claim 4 wherein the electrically conductive material provides for electrical interconnection between the bottom and top electrodes and a contact pad formed on the substrate.

6. The resonator of claim 4 wherein the electrically conductive material provides for electrical interconnection between the bottom electrode and active devices formed in the substrate.

7. The resonator of claim 4 wherein the electrically conductive material also contacts the top Bragg structure.

8. The resonator of claim 7 further comprising a passivation layer formed over the top Bragg layer and electrically conductive material.

9. The resonator of claim 8 wherein an insulating material is formed over the passivation layer.

10. The resonator of claim 9 wherein the collar region, Bragg structure, passivation layer and insulating material together isolate the piezoelectric material in the active region of the resonator from the external environment.

11. The resonator of claim 10 further comprising a plastic package in which the resonator is disposed.

12. The resonator of claim 4 further comprising a cap structure that is separated from the top electrode by an air gap.

13. The resonator of claim 12 wherein the top Bragg structure is supported by a pillar extending from the substrate.

14. The resonator of claim 13 wherein the top Bragg structure has a cap layer formed thereon.

15. The resonator of claim 1 further comprising a temperature compensating layer formed on the piezoelectric layer.

16. The resonator of claim 1 wherein the resonator, in operation, has both a parallel resonance and a series resonance and wherein the perimeter collar region is configured such that the resonator exhibits a shift in the impedance response of the resonator as a function of frequency at a rate of about 5 ppm per year or less.

17. A resonator comprising:
   a substrate;
   a piezoelectric layer formed over said substrate at least a portion of the piezoelectric layer being disposed between two electrodes, the piezoelectric layer having two defined regions, an active interior region and a perimeter collar region wherein the regions are defined by a spacer;

a cap layer formed over the piezoelectric layer, wherein the piezoelectric layer is separated from the substrate and supported on the substrate by the cap layer.

18. The resonator of claim 17 wherein the cap layer is constructed as a Bragg layer.

19. The resonator of claim 17 wherein the resonator, in operation, has both a parallel resonance and a series resonance and wherein the cap layer and the perimeter collar region are configured such that the resonator exhibits a shift in the impedance response of the resonator as a function of frequency at a rate of about 5 ppm per year or less.

* * * * *